US010432168B2

(12) United States Patent
Kapusta et al.

(10) Patent No.: US 10,432,168 B2
(45) Date of Patent: Oct. 1, 2019

(54) SYSTEMS AND METHODS FOR QUARTZ WAFER BONDING

(71) Applicant: GENERAL ELECTRIC COMPANY, Schenectady, NY (US)

(72) Inventors: Christopher James Kapusta, Delanson, NY (US); Marco Francesco Aimi, Schenectady, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 752 days.

(21) Appl. No.: 14/841,314

(22) Filed: Aug. 31, 2015

(65) Prior Publication Data
US 2017/0063326 A1    Mar. 2, 2017

(51) Int. Cl.
| | | |
|---|---|---|
| *H03H 9/02* | (2006.01) | |
| *H03H 9/10* | (2006.01) | |
| *H03H 9/19* | (2006.01) | |
| *H03H 3/08* | (2006.01) | |
| *H03H 9/05* | (2006.01) | |
| *G01L 3/10* | (2006.01) | |
| *G01L 1/16* | (2006.01) | |
| *H03H 3/04* | (2006.01) | |

(52) U.S. Cl.
CPC ......... *H03H 9/02535* (2013.01); *G01L 1/165* (2013.01); *G01L 3/10* (2013.01); *H03H 3/08* (2013.01); *H03H 9/058* (2013.01); *H03H 9/0595* (2013.01); *H03H 9/10* (2013.01); *H03H 9/1064* (2013.01); *H03H 9/19* (2013.01); *H03H 2003/0478* (2013.01)

(58) Field of Classification Search
CPC ..... H03H 9/02535; H03H 9/19; H03H 9/1064
See application file for complete search history.

(56) References Cited

U.S. PATENT DOCUMENTS

| | | | | |
|---|---|---|---|---|
| 3,444,732 A | * | 5/1969 | McKinley | ............... B29C 65/18 |
| | | | | 156/378 |
| 3,826,701 A | * | 7/1974 | Miller | ..................... B29C 65/18 |
| | | | | 156/308.2 |
| 3,925,139 A | * | 12/1975 | Simmons | ................ B29C 65/18 |
| | | | | 156/358 |
| 4,670,089 A | * | 6/1987 | Hanson | .................... C08J 5/128 |
| | | | | 156/307.1 |

(Continued)

FOREIGN PATENT DOCUMENTS

| | | |
|---|---|---|
| CN | 2510267 Y | 9/2002 |
| CN | 101450788 A | 6/2009 |

(Continued)

OTHER PUBLICATIONS https://www.makeitfrom.com/material-properties/Liquid-Crystal-Polymer-LCP (Year: 2004).*

(Continued)

*Primary Examiner* — Mark A Osele
*Assistant Examiner* — Christopher C Caillouet
(74) *Attorney, Agent, or Firm* — Fletcher Yoder, P.C.

(57) ABSTRACT

In one embodiment, a bonded quartz wafer package includes a first quartz wafer including at least one quartz-based device, a second quartz wafer disposed above the first quartz wafer, and a liquid crystal polymer (LCP) bonding layer disposed in between the first and second quartz wafers that bonds the first and second quartz wafers together.

26 Claims, 13 Drawing Sheets

(56) References Cited

U.S. PATENT DOCUMENTS

| | | | |
|---|---|---|---|
| 5,804,004 | A * | 9/1998 | Tuckerman ............ H01L 24/78 156/60 |
| 7,504,277 | B2 * | 3/2009 | Fletcher ............ H01L 27/14634 257/458 |
| 7,605,466 | B2 | 10/2009 | Aimi et al. |
| 7,952,187 | B2 | 5/2011 | Kapusta et al. |
| 8,098,001 | B2 * | 1/2012 | Pahl ................... H03H 9/02574 310/328 |
| 8,653,673 | B2 | 2/2014 | Hallock et al. |
| 8,693,203 | B2 | 4/2014 | Rendek, Jr. et al. |
| 8,748,755 | B2 | 6/2014 | Inoue et al. |
| 2005/0214974 | A1 * | 9/2005 | Field ................... H03H 3/0073 438/106 |
| 2007/0006434 | A1 | 1/2007 | Aoki |
| 2007/0020807 | A1 | 1/2007 | Geefay et al. |
| 2009/0096088 | A1 | 4/2009 | Aimi et al. |
| 2009/0224851 | A1 * | 9/2009 | Feiertag ................ H03H 9/059 333/186 |
| 2010/0087024 | A1 * | 4/2010 | Hawat ................... B81B 7/0077 438/51 |
| 2013/0313947 | A1 | 11/2013 | Chen et al. |
| 2014/0069577 | A1 * | 3/2014 | Cohen ..................... H01L 45/06 156/230 |
| 2014/0264868 | A1 * | 9/2014 | Radulescu ........ H01L 23/53247 257/751 |

FOREIGN PATENT DOCUMENTS

| | | |
|---|---|---|
| EP | 1 057 850 A2 | 12/2000 |
| JP | 2803805 B | 9/1998 |
| JP | 2008-524590 A | 7/2008 |
| JP | 2012-189335 A | 10/2012 |
| TW | 201214594 A | 4/2012 |
| WO | 2008/023465 A1 | 2/2008 |
| WO | 2011/115041 A1 | 9/2011 |

OTHER PUBLICATIONS https://www.engineeringtoolbox.com/young-modulus-d_417.html (Year: 2003).*
Pham, A.; "Liquid Crystal Polymer for Microwave and Millimeter-Wave Multi-Layer Packages and Modules", Proceedings of the 40th European Microwave Conference, Sep. 2010, p. 352.
Wang, Xeufeng; "Micromachining Techniques for Liquid Crystal Polymer", Micro Electro Mechanical Systems, Jan. 2001, pp. 126-130.
ULTRALAM 3908 Bondply ULTRALAM 3000 Series Liquid Crystalline Polymer Circuit Material, Advance Circuit Material Division, Chandler AZ, https://www.rogerscorp.com/documents/731/acs/ULTRALAM-3000-LCP-Prepreg-ULTRALAM-3908.pdf, Accessed Apr. 14, 2015.
Office Action issued in connection with corresponding CA Application No. 2939742 dated Jun. 16, 2017.
Notification of Reasons for Refusal issued in connection with corresponding JP Application No. 2016-160272 dated Jul. 25, 2017.
Thompson D., et al., "Rf Characteristics of Thin Film Liquid Crystal Polymer (LCP) Packages for RF MEMS and MMIC integration", IEEE MTT-S International Microwave Symposium, XP010844612, pp. 857-860, Jun. 12, 2005.
European Search Report and Opinion issued in connection with corresponding EP Application No. 16185199.3 dated Jan. 13, 2017.
Machine Translation and First Office Action and Search issued in connection with corresponding CN Application No. 201610776975.2 dated Jun. 26, 2018.

* cited by examiner

SYSTEMS AND METHODS FOR QUARTZ WAFER BONDING

BACKGROUND

The subject matter disclosed herein relates to electrical devices, and more specifically, to techniques suitable for wafer bonding quartz-based devices, including quartz-based surface acoustic wave (SAW) devices.

SAW devices may be used in a variety of applications. For example, in electronic circuits, SAW devices may be used as filters, oscillators, and/or transformers. Additionally, SAW devices may be used as sensors for torque, temperature, pressure, and/or other parameters. Certain processes, such as engine, transmission, and the like, may be more precisely controlled using feedback from the SAW device sensors. To put the SAW devices in this environment they need to be packaged. Typically these packages are hermetic discrete packages that the SAW is placed into and sealed. When putting the SAW into these packages, the sensitivity is reduced, so it is desired to have the SAW mounted directly to the strain point. For this reason a wafer level package is desired. SAW devices may include a piezoelectric material, such as a single crystal quartz wafer, that generates an electrical signal in response to mechanical stress, enabling the detection of acoustic waves. These acoustic waves can be used to determine, for example, the torque of a rotating shaft. However, the properties of single crystal quartz can make bonding difficult when manufacturing a quartz-based package. Further, the single crystal quartz wafer is very thin and, therefore, may break easily when uneven thermal and/or mechanical stress is applied. A process that overcomes these challenges during bonding is desired.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter disclosed herein may encompass a variety of forms that may be similar to or different from the embodiments set forth below.

In one embodiment, a bonded quartz wafer package includes a first quartz wafer including at least one quartz-based device, a second quartz wafer disposed above the first quartz wafer, and a liquid crystal polymer (LCP) bonding layer disposed in between the first and second quartz wafers that bonds the first and second quartz wafers together.

In one embodiment, a method includes arranging a stack of materials by disposing a first quartz wafer above a first silicon (Si) handle wafer, disposing a second quartz wafer above the first quartz wafer, disposing a liquid crystal polymer (LCP) sheet material between the first and second quartz wafer, disposing a second Si handle wafer above the second quartz wafer, and bonding the stack of materials to form a bonded quartz wafer package. The first quartz wafer is bonded to the second quartz wafer via the LCP sheet material.

In one embodiment, a method for bonding a quartz wafer package includes bonding a first quartz wafer to a second quartz wafer using a bonding layer disposed in between the first and second quartz wafers to form the quartz wafer package. The bonding layer includes a liquid crystal polymer (LCP) material.

In one embodiment, a surface acoustic wave (SAW) sensor includes a first quartz wafer including at least one quartz-based SAW device, a second quartz wafer disposed above the first quartz wafer, and a liquid crystal polymer (LCP) bonding layer disposed in between the first and second quartz wafers that bonds the first and second quartz wafers together.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1A:
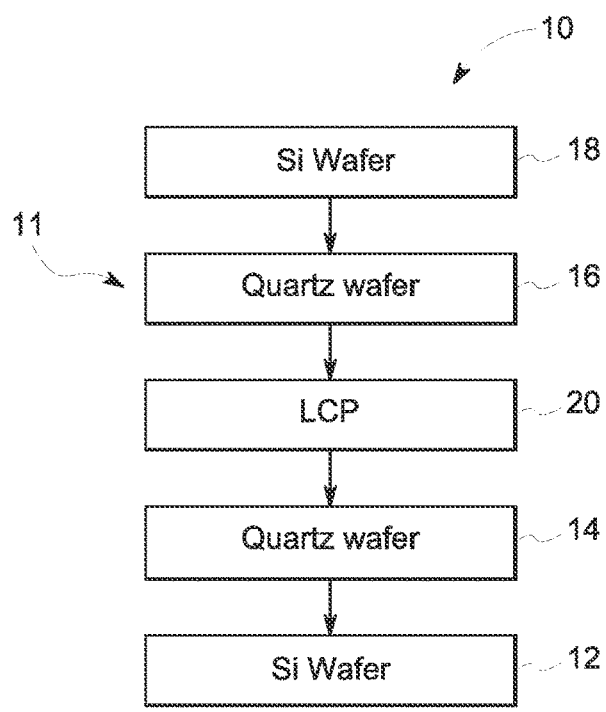
FIG. 1A is a cross-sectional diagram of a bonded quartz wafer package including silicon (Si) handling wafers.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Single crystal quartz may provide certain benefits (e.g., precise measurement of frequencies of mechanical stresses) when functioning as piezoelectric materials in electrical devices. For example, the single crystal quartz may include surface acoustic wave (SAW) devices that use one or more interdigitating structures to convert acoustic waves into electrical signals by channeling the piezoelectric effect of the single crystal quartz. However, as noted above, some properties of single crystal quartz provide bonding challenges. One such challenge is that the coefficient of thermal expansion (CTE) of single crystal quartz can be lower than that of certain bonding materials (e.g., glass frit materials). Further, another challenge is that single crystal quartz is typically fragile and can be easily broken when uneven stress is applied.

Accordingly, some embodiments of the present disclosure relate to methods of bonding single crystal quartz wafers that overcome the challenges. For example, a bonding layer with a CTE that closely matches the CTE for the single crystal quartz may be used. In some embodiments, the bonding layer may include a liquid crystal polymer (LCP) material, which may provide both mechanical strength and hermetic sealing. The LCP bonding layer may be inserted in between two single crystal quartz wafers (e.g., a device wafer and a cap wafer) to facilitate effective bonding of the wafers into a hermetic wafer package. Further, bonding the two single crystal quartz wafers using the LCP, as presently disclosed, enables wafer bonding without the use of spacers or stand-offs to define a wafer-to-wafer gap. In addition, to overcome the delicateness of the single crystal quartz, handling wafers (e.g., Si handling wafers) may be placed above and below the single crystal quartz wafers to improve ease of handling and durability. As discussed in detail below, bonding forces, temperatures, and durations of forces may be controlled via a wafer bonder tool during the bonding process to enable effective bonding of the quartz wafer package. It may be appreciated that, while the remainder of the disclosure focuses on quartz-based SAW devices in particular, the presently disclosed bonding technique is applicable to the bonding of any quartz-based device.

Figure 1B:
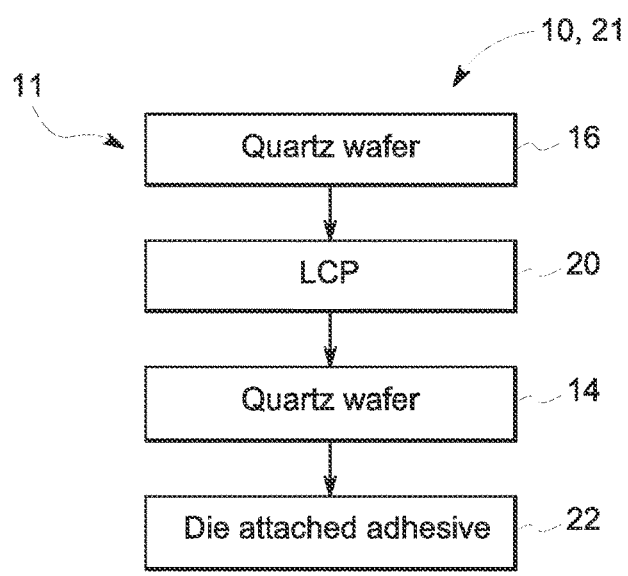
FIG. 1B is a cross-sectional diagram of the bonded quartz wafer package of FIG. 1A after the Si handling wafers have been removed, in accordance with embodiments of the present disclosure.

FIGS. 1A and 1B are cross-sectional diagrams of a bonded quartz wafer package 10, in accordance with embodiments of the present disclosure. The bonded quartz wafer package 10 of FIG. 1A includes a stack 11 of materials that is bonded together, as described in detail below. The stack 11 is arranged prior to bonding and includes a first Si handling wafer 12, a first single crystal quartz wafer or layer 14 disposed above the first Si handling wafer 12, a second single crystal quartz wafer 16 disposed above the first single crystal quartz wafer 16, and a second Si handling wafer 18 disposed above the second single crystal quartz wafer 18. As discussed in greater detail below, a LCP bonding layer 20 is disposed between the first quartz wafer 14 and the second quartz wafer 16 in the stack 11. Further, the quartz wafer 14 may include any number of quartz-based devices (e.g., quartz SAW devices), and as such, the first quartz wafer 14 may be referred to herein as the device wafer 14. The second quartz wafer 16 does not include any device structures, and as such, may be referred to herein as the capping wafer 16, because it provides the cap or ceiling for the cavities around the quartz-based devices of the device wafer 14. FIG. 1B illustrates the structure of the bonded quartz wafer package 10 after the Si handling wafers 12 and 18 have been removed, as discussed below.

The thicknesses of the wafers 12, 14, 16, and 18 and the LCP bonding layer 20 may be different in certain embodiments. In some embodiments, the first and second Si handling wafers 12 and 18 may have a thickness in a range of 100 micrometers (µm) thick to 2000 µm thick, the device wafer 14 and the capping wafer 16 may have a thickness in a range of 50 µm thick to 1000 µm thick, and the LCP bonding layer 20 may have a thickness in a range of 10 µm thick to 200 µm thick. In one example embodiment, the first and second Si handling wafers 12 and 18 may each be approximately 500 micrometers (µm) thick, the device wafer 14 and the capping wafer 16 may be approximately 200 µm thick, and the LCP bonding layer 20 may be approximately 50 µm thick. The LCP bonding layer 20 may be cut from a film having a predetermined thickness to define the final cavity height (e.g., gap between the device wafer 14 and the capping wafer 16). Also, the LCP bonding layer 20 may have a lower CTE than other bonding materials (e.g., glass frit) and, thus, may better conform to the single crystal quartz material properties during bonding.

Another benefit of the LCP bonding layer 20 relates to its elastic modulus. A load may be shared between the device wafer 14 and the materials disposed above the device wafer 14 (e.g., LCP bonding layer 20). Thus, for quartz-based SAW torque sensors, for example, a stiffer bonding layer 20 results in a deceptively lower strain measurement by the SAW devices, since the strain is partially transferred to the stiffer bonding layer 20. Accordingly, the presently disclosed LCP bonding layer 20 has a lower elastic modulus than some other bonding materials (e.g., glass frit) and, therefore, a greater amount of the strain is able to reach and be detected by the SAW devices of the device wafer 14. As a result, the LCP bonding layer 20 enables greater sensitivity and enhanced accuracy for certain types of quartz-based devices (e.g., quartz SAW devices) compared to other types of bonding materials.

As previously noted, the Si handling wafers 12 and 18 may be used to inhibit the fragile single crystal quartz from cracking during bonding by adding thickness and mechanical strength to the stack 11. However, after the stack 11 is bonded, the first and second Si handling wafers 12 and 18 may be removed, resulting in the bonded quartz wafer package 10 depicted in FIG. 1B. It should be noted that the bonded quartz wafer package 10 shown in FIG. 1B may be diced into individual dice bonded quartz wafer packages 21 and a die attached adhesive layer 22 may be applied to each dice bonded quartz wafer package 21. The die attached adhesive layer 22 may be used to attach the dice bonded quartz wafer package 21 to a component to be monitored, such as a shaft of a helicopter, airplane, automobile, boat, transmission, and the like. It should be noted that the die attached adhesive layer 22 may couple to any suitable substrate. As will be discussed in detail below, in certain embodiments, the viscoelastic properties of the die attached adhesive layer 22 and the LCP bonding layer 20 may be matched to provide a self-compensating dice bonded quartz wafer package 21. As shown, the die attached adhesive layer 22 is exposed and may be used to couple a portion of the dice bonded quartz wafer package 21 to a suitable structure.

It should be understood that, in some embodiments, the quartz-based devices present within the device wafer 14 may function as SAW torque sensors. For example, as mentioned above, after dicing, the packaged SAW torque sensors may be placed on any suitable part of an aircraft, automobile, or machine, such as a shaft. When torque is applied to the shaft, there is an external strain on the shaft that is transferred to the device wafer 14 of the dice bonded quartz wafer package 21, through the die attached adhesive 22. A surface acoustic wave indicative of the strain propagates across the single crystal quartz material, and the frequency of the wave may increase and decrease between interdigitating structures of the SAW devices of the device wafer 14 based on the spacing of the interdigitating structures. That is, as the single crystal quartz material is strained, the spacing of the interdigitating structures may change and the frequency may change. A processor that receives electrical signals indicative of the wave from the torque sensor may be analyzed by a processor to determine the frequency of the wave (e.g., strain) and the orientation of the interdigitating structures.

Figure 2:
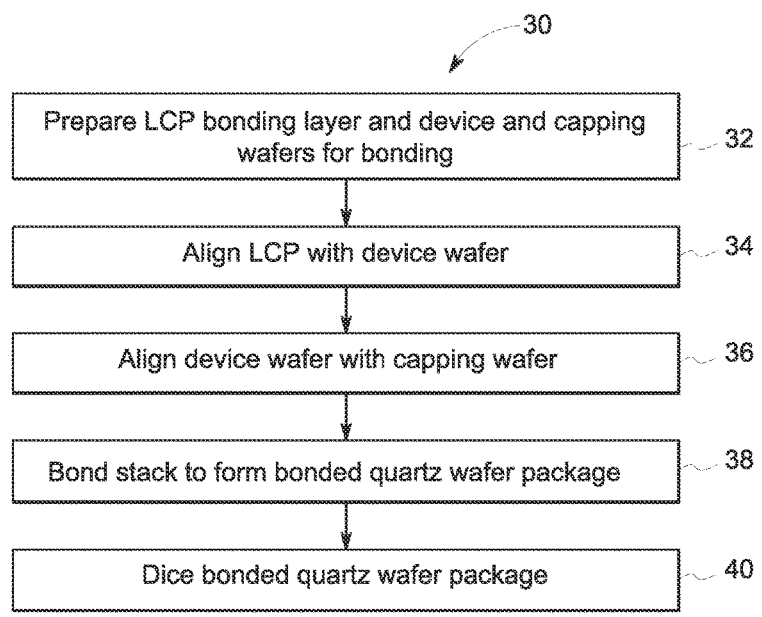
FIG. 2 is a flow diagram of a general method suitable for packaging the bonded quartz wafer package of FIGS. 1A and 1B, in accordance with embodiments of the present disclosure.

FIG. 2 is a flow diagram of a general method 30 suitable for packaging the bonded quartz wafer package 10 of FIGS. 1A and 1B, in accordance embodiments of the present disclosure. It should be noted that the details of each step of the method 30 are described in further detail in separate flow diagrams below. In other embodiments, the method 30 may include fewer steps and/or steps performed in orders different than the embodiment presented in FIG. 2.

The embodiment of the method 30 illustrated in FIG. 2 includes preparing the LCP bonding layer 20, device wafer 14, and capping wafer 16 for bonding (method block 32). The illustrated method 30 also includes aligning the LCP bonding layer 20 with the device wafer 14 in the stack 11 (method block 34) and aligning the device wafer 14 with the capping wafer 16 in the stack 11 (method block 30). The illustrated method 30 also includes bonding the stack 11 to form the bonded quartz wafer package 10 (method block 38) and dicing the bonded quartz wafer package 10 into individual dice bonded quartz wafer packages 21 (method block 40).

Figure 3:
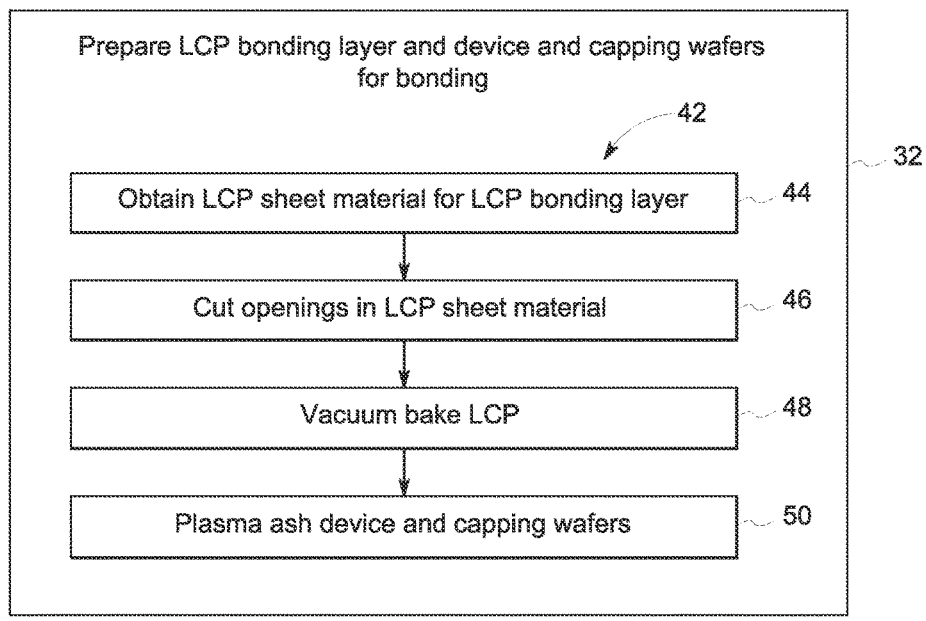
FIG. 3 is a flow diagram of a method suitable for preparing a liquid crystal polymer (LCP) bonding layer and a first and second quartz wafer for bonding, in accordance with embodiments of the present disclosure.

More specifically, FIG. 3 is a flow diagram of an embodiment of a method 42 suitable for preparing the LCP bonding layer 20, the device wafer 14, and the capping wafer 16 for bonding (method block 32 of FIG. 2). The method 42 illustrated in FIG. 3 includes obtaining a LCP sheet material for the LCP bonding layer 20 (method block 44) and cutting (e.g., laser cutting) openings in the sheet material (method block 46) to fit around the devices of the device wafer 14 when the LCP sheet material is disposed between the device wafer 14 and capping wafer 16. Additionally, the method 42 illustrated in FIG. 3 includes vacuum baking the LCP sheet material for a desired time period (e.g., 1, 2, 3, 4, or 5 hours) at a desired temperature (e.g., 100, 105, 110, 115, or 120° C.) (method block 48). The method 42 illustrated in FIG. 3 also includes plasma ashing the wafers 14 and 16 for a desired time period (e.g., 1, 2, 3, 4, 5, or 6 minutes) in any suitable structure (e.g., barrel) (method block 50).

Figure 4:
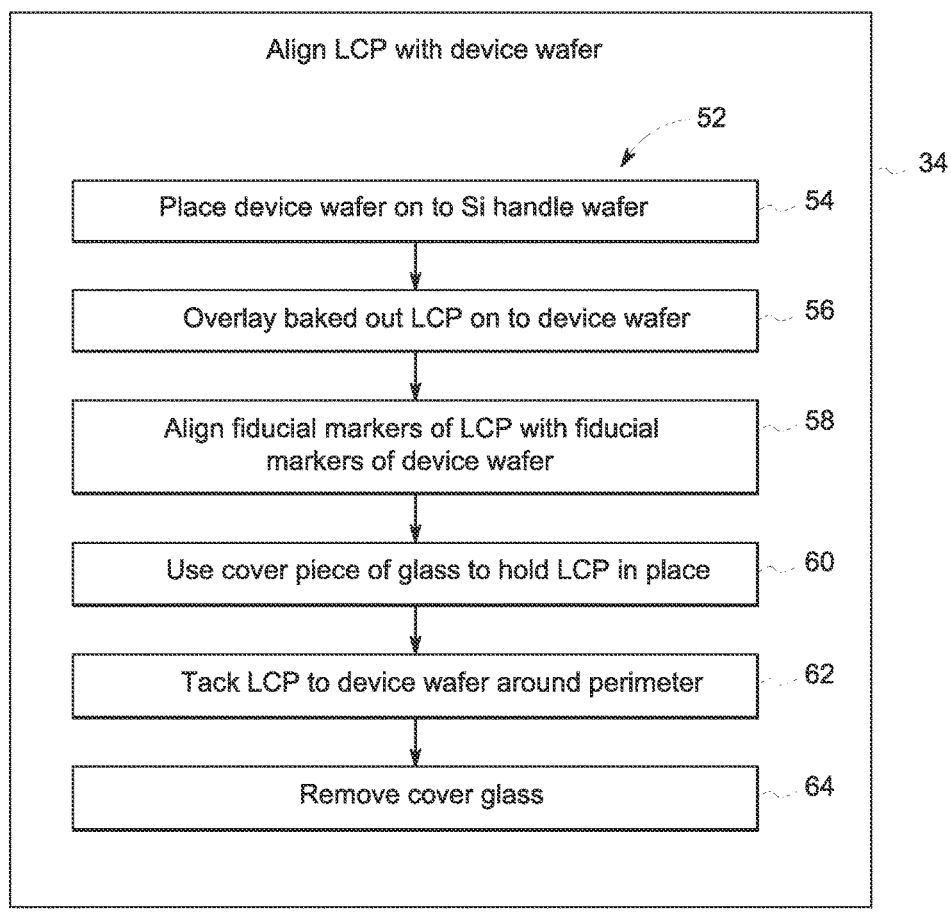
FIG. 4 is a flow diagram of a method suitable for aligning a LCP bonding layer with a first quartz wafer, in accordance with embodiments of the present disclosure.

FIG. 4 is a flow diagram of an embodiment of a method 52 suitable for aligning the LCP bonding layer 20 with the device wafer 14 (method block 34 of FIG. 2), in accordance with embodiments of the present disclosure. The method 52 illustrated in FIG. 4 includes placing the device wafer 14 onto the first Si handle wafer 12 (method block 54). In some embodiments, a 500 µm thick Si handle wafer may be used for the first Si handle wafer 12. However, any desired thickness may be used, as appropriate (e.g., 400, 450, 500, 550, or 600 µm). The illustrated method 52 includes overlaying the baked LCP bonding layer 20 onto the device wafer 14 (method block 56). Then, the illustrated method 52 includes aligning fiducial markers of the LCP bonding layer 20 with fiducial markers of the device wafer 14 (method block 58). In certain embodiments, the alignment of method block 58 may be performed manually using a zoom scope or automatically using an alignment device. The illustrated method 52 may also include using a cover piece of glass to hold the LCP bonding layer 20 in place on the device wafer 14 (method block 60). The LCP bonding layer 20 may be tacked to the device wafer 14 around the perimeter of the LCP bonding layer 20 a desired distance apart (e.g., 1-5 millimeters (mm), 5-10 mm, or 10-15 mm) (method block 62). In some embodiments, a soldering iron may be used to tack the LCP bonding layer 20 to the device wafer 14 and the soldering iron may be set to a desired temperature (e.g., 640, 650, 660, 670, or 680° F.). The illustrated method 52 also includes removing the cover glass (method block 64).

Figure 5:
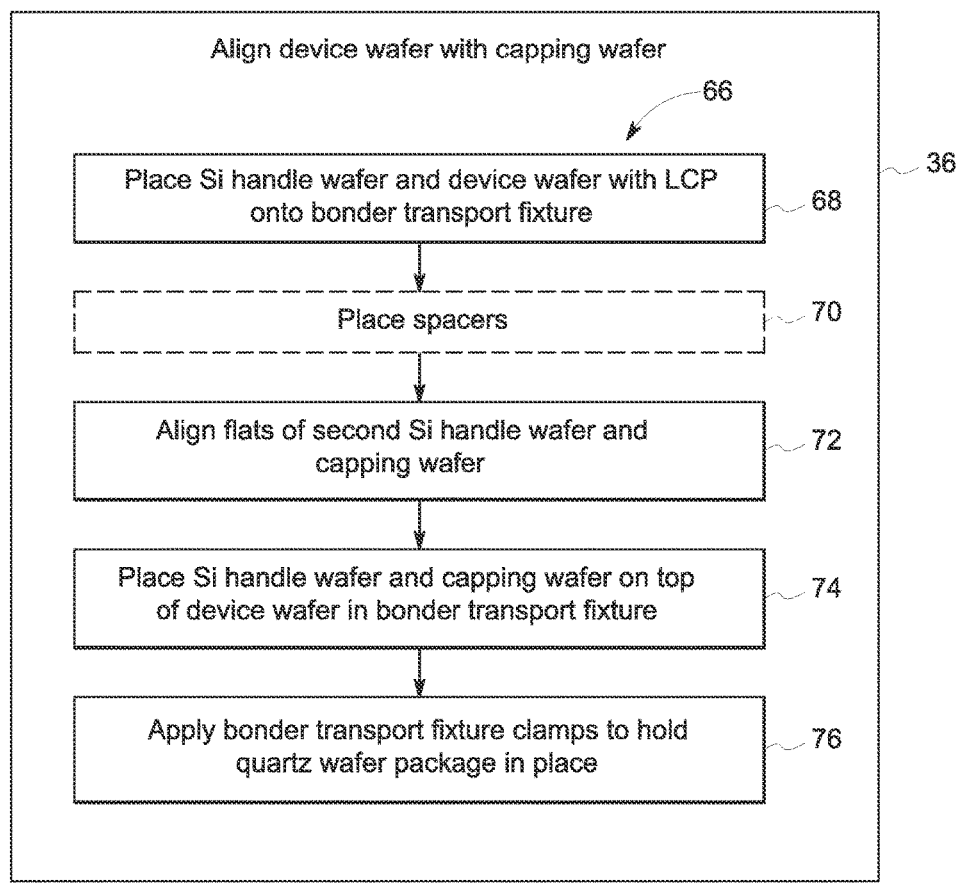
FIG. 5 is a flow diagram of a method suitable for aligning a first quartz wafer with a second quartz wafer, in accordance with embodiments of the present disclosure.

FIG. 5 is a flow diagram of an embodiment of a method 66 suitable for aligning a first quartz wafer with a second quartz wafer (method block 36 of FIG. 2). The illustrated method 66 includes placing the first Si handle wafer 12 and device wafer 14, with the attached LCP bonding layer 20, onto a wafer bonder transport fixture (method block 68). The loading of method block 68 may include verifying that the first Si handle wafer 12 and the device wafer 14 have a flat orientation in the wafer bonder transport fixture. In some embodiments, as a result of using the LCP bonding layer 20, the bonded quartz wafer package 10 may not include spacers disposed between the device wafer 14 and the capping wafer 16. However, it should be noted that, in some embodiments, the illustrated method 66 may include placing spacers (e.g., 40 micron) into cavity locations (e.g., 8, 9, or 10 locations) on the device wafer 14 (optional method block 70).

Further, the illustrated method 66 also includes aligning flats of the capping wafer 16 and the second Si handling wafer 18 together (method block 72). The second Si handling wafer may be 500 µm thick. However, any appropriate thickness (e.g., 400, 450, 500, 550, or 600 µm) may be used for the second Si handling wafer 18. Then, the capping wafer 16 and the second Si handling wafer 18 may be placed on top of the device wafer 14 in the wafer bonder transport fixture to form the stack 11 (method block 74). The illustrated method 66 also includes applying clamps of the wafer bonder transport fixture to hold the stack 11 in place (method block 76).

Figure 6:
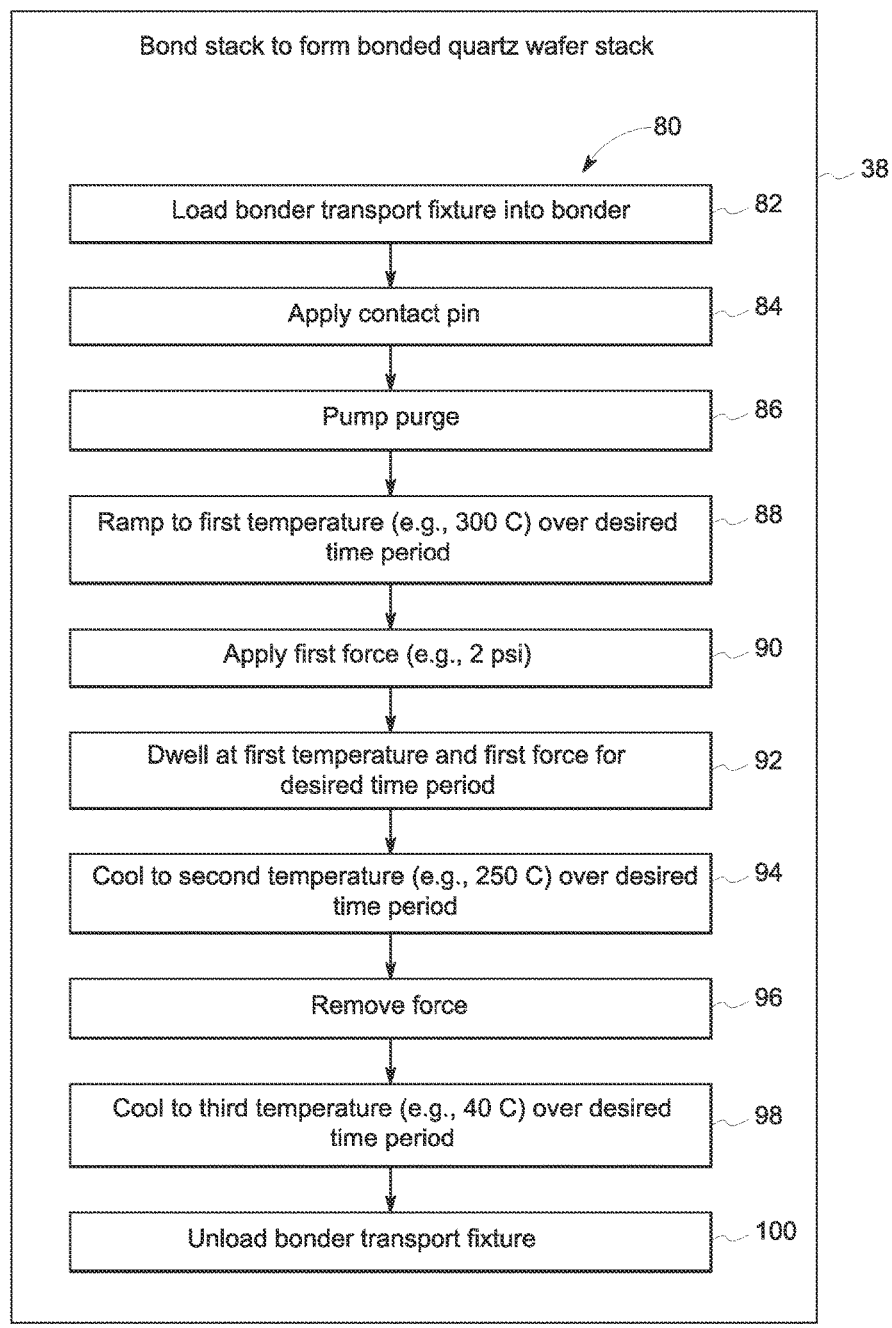
FIG. 6 is a flow diagram of a general method suitable for bonding to form the bonded quartz wafer package of FIGS. 1A and 1B, in accordance with embodiments of the present disclosure.

Once the stack 11 is arranged in the wafer bonder transport fixture, the wafer bonder transport fixture may be loaded onto a bonder tool and a set of instructions representing a bonding process (e.g., a "recipe") may be loaded on the wafer bonder tool. The instructions may be executed by the wafer bonder tool to run the bonding process. FIGS. 6-8 illustrate flow diagrams of example embodiments of methods including instructions for bonding the device wafer 14 and the capping wafer 16 via the LCP bonding layer 20 to form the bonded quartz wafer package 10.

Starting with FIG. 6, a flow diagram of an embodiment of a general method 80 suitable for bonding the stack 11 to form the bonded quartz wafer package of FIGS. 1A and 1B (method block 38 of FIG. 2) is illustrated. The illustrated method 80 includes loading the wafer bonder transport fixture including the quartz wafer package (e.g., stack 11) into the wafer bonder tool (method block 82) and applying a contact pin of the wafer bonder tool (method block 84). The contact pin of the wafer bonder tool may provide clamping force to keep the components of the stack 11 from moving and losing alignment. Next, the method 80 may include pump purging the sealed chamber of the wafer bonder tool that contains the stack 11 with nitrogen or other desired atmosphere (method block 86). Pump purging the sealed chamber may enable controlling the environment in the chamber and also the device cavities from undesirable elements (e.g., moisture).

The illustrated method 80 also includes ramping (e.g., increasing) to a first temperature (e.g., 250, 275, 300, 325, or 350° C.) inside the chamber over a desired time period (e.g., 800, 850, 900, or 950 seconds). The first temperature may enable thermal expansion of the LCP and/or the quartz material to facilitate bonding. Then, once the first temperature is reached, a first force (e.g., 1, 2, 3, or 4 psi) may be applied by the contact pin (method block 90). In some instances, the force of the contact pin may minimize bowing of the quartz materials in the device wafer 14 and capping wafer 16. After the first force is applied, the illustrated method 80 includes dwelling at the first temperature and the first force for a desired time period (e.g., 13, 14, 15, 16, 17 minutes) (method block 92) to allow the quartz layers 14 and 16, the LCP bonding layer 20, and the Si handle wafers 12 and 18 to equilibrate.

Continuing through the method 80 illustrated in FIG. 6, after the desired time period expires, the illustrated method 80 includes cooling to a second temperature (e.g., 200, 225, 250, 275, or 300° C.), lower than the first temperature, over a desired period of time (e.g., 13, 14, 15, 16, 17 minutes) (method block 94). Slowly cooling to the second temperature may enable movement of the quartz layers 14 and 16 and LCP bonding material 20 while equilibrating and inhibit cracking of the single crystal quartz materials. Then, the force from the contact pin may be removed (method block 96) and the chamber may be cooled to a third temperature (e.g., 30, 35, 40, or 45° C.), lower than the first and second temperatures, over a desired time period. (e.g., 500, 550, 600, or 650 seconds). Then, the bonding process concludes and the wafer bonder transport fixture is unloaded from the bonder tool (method block 100). At the end of the illustrated method 80, the device wafer 14 and the capping wafer 16 are bonded via the LCP bonding layer 20 to form the bonded quartz wafer package 10.

Figure 7A:
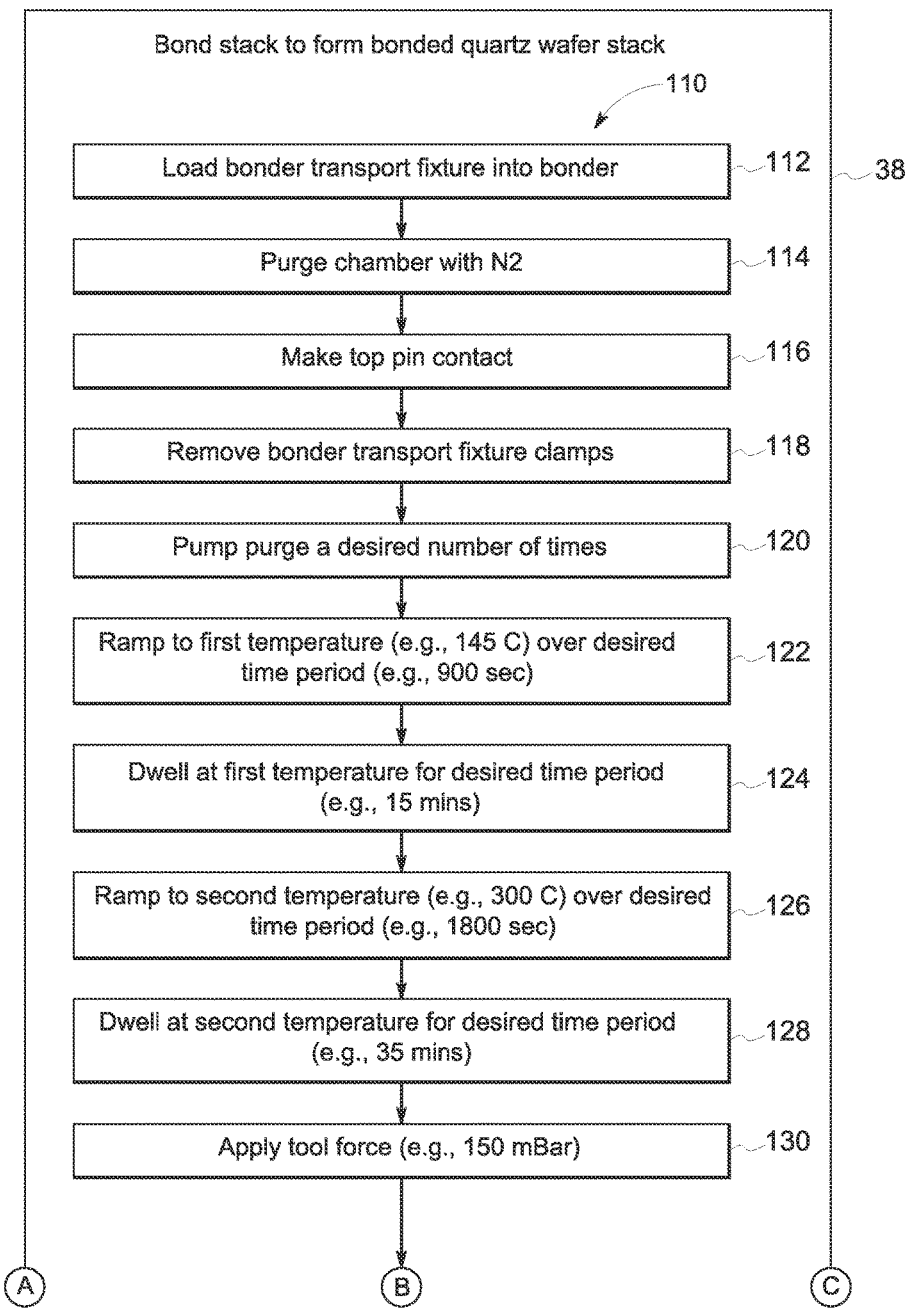
FIGS. 7A and 7B is a flow diagram of an example method suitable for bonding to form the bonded quartz wafer package of FIGS. 1A and 1B using a wafer bonder tool including an anodic pin top plate, in accordance with embodiments of the present disclosure.
Figure 7B:
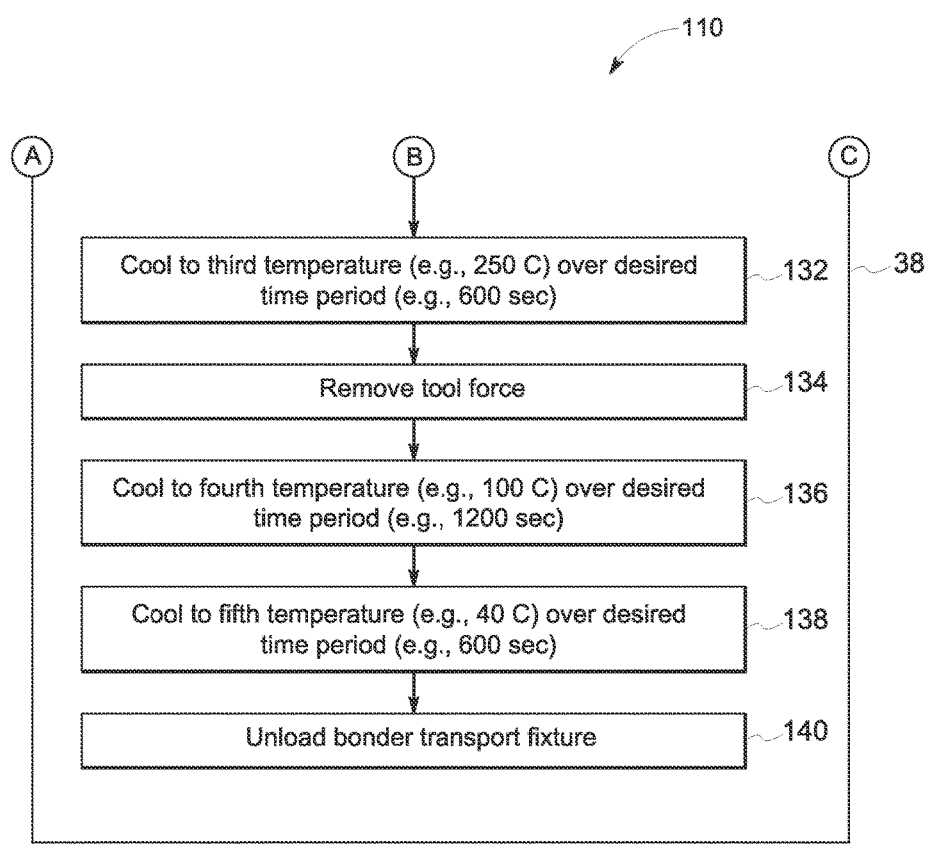

FIGS. 7A and 7B is a flow diagram of an embodiment of a method 110 suitable for bonding the stack 11 to form the bonded quartz wafer package 10 of FIGS. 1A and 1B (method block 38 of FIG. 2) using a wafer bonder tool including an anodic pin top plate. The illustrated method 110 includes loading the wafer bonder transport fixture including the quartz wafer package (e.g., stack 11) into the wafer bonding tool (method block 112). The chamber of the bonder tool may be purged with nitrogen to prevent moisture from affecting the environment inside the cavities of the devices (e.g., SAW devices) of the device wafer 14 (method block 114). Then, the top pin may be applied to make contact with the stack 11 (method block 116) and the wafer bonder transport fixture clamps may be removed (method block 118), since the top pin is holding the materials of the stack 11 in place. The method 110 may include pump purging the chamber a desired number of times (e.g., 1, 2, 3, 4, 5) (method block 120) to further control the environment in and around the stack 11.

The illustrated method 110 includes ramping to a first temperature (e.g., 135, 140, 145, 150, 155° C.) inside the chamber over a desired time period (e.g., 800, 850, 900, 950 seconds) (method block 122). Then, once the first temperature is reached, the illustrated method 110 includes dwelling at the first temperature for a desired time period (e.g., 13, 14, 15, 16, 17 minutes) (method block 124) to allow the quartz materials, LCP, and Si to equilibrate. After the desired time period expires, the method 110 may include ramping to a second temperature (e.g., 280, 290, 300, 310, 320° C.), higher than the first temperature, over a desired period of time (e.g., 1600, 1700, 1800, 1900, 2000 seconds) (method block 126). Once the second temperature is reached, the illustrated method 110 includes dwelling at the second temperature for a desired time period (e.g., 25, 30, 35, 40, 45 minutes) (method block 128). The wafer bonder tool may apply force (e.g., 135, 150, 165 millibar) via the anodic top pin (method block 130) so the LCP bonding layer 20, the device wafer 14, and capping wafer 16 are pressed together to facilitate bonding.

The illustrated method 110 includes cooling to a third temperature (e.g., 240, 250, 260° C.) over a desired time period. (e.g., 500, 550, 600, 650 seconds) (method block 132). Then, the wafer bonder tool force may be removed (method block 134) and the temperature may be cooled to a fourth temperature (e.g., 90, 100, 110° C.) over a desired time period (e.g., 1100, 1200, 1300 seconds) (method block 136). Once at the fourth temperature, the temperature may be cooled again to a fifth temperature (e.g., 30, 40, 50° C.) over a desired time period (e.g., 550, 600, 650 seconds) (method block 138). The bonding process may subsequently conclude and the wafer bonder transport fixture may be unloaded from the bonder tool (method block 140). At the end of the illustrated method 80, the device wafer 14 and the capping wafer 16 are bonded via the LCP bonding layer 20 to form the bonded quartz wafer package 10 illustrated in FIGS. 1A and 1B.

Figure 8A:
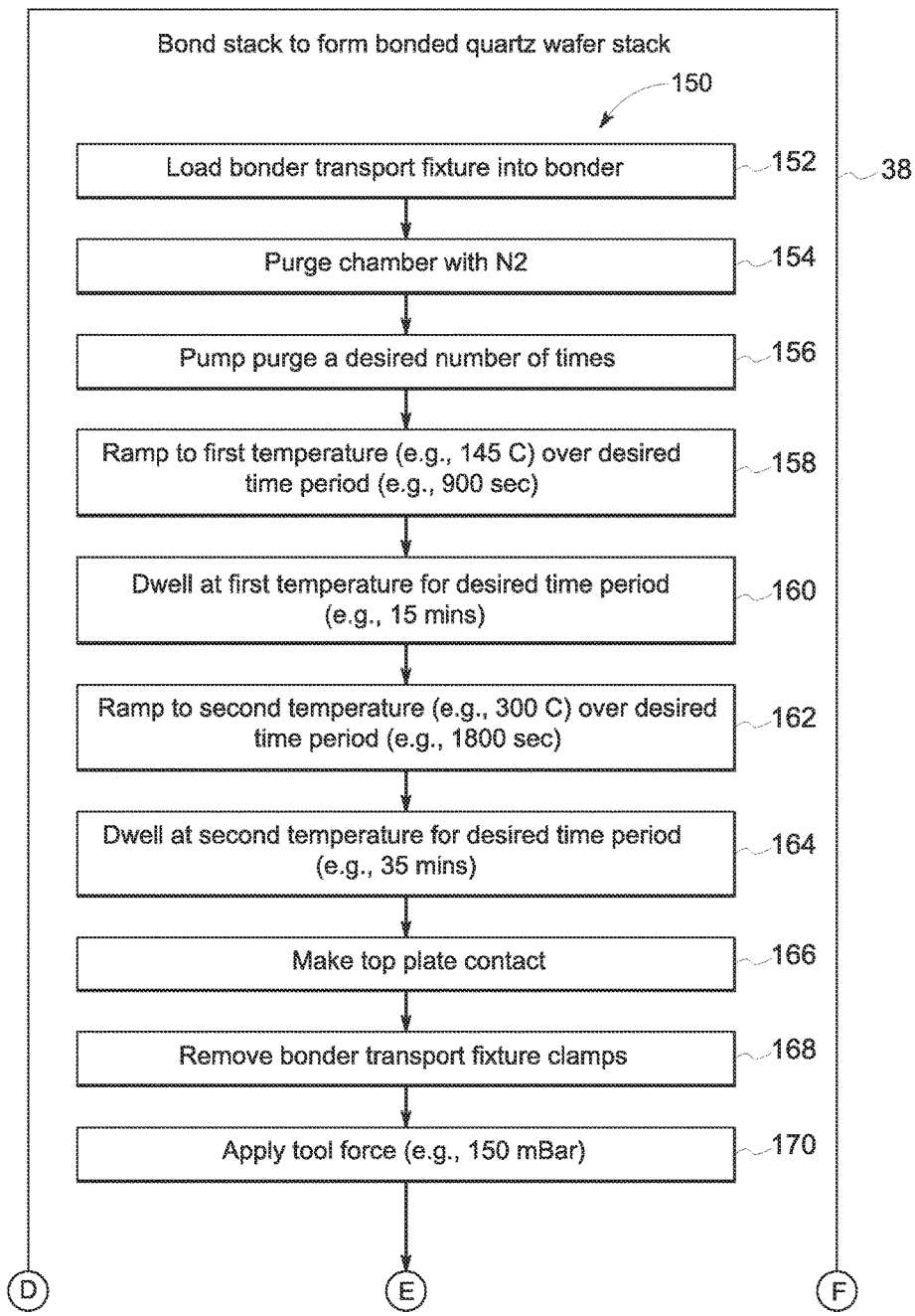
FIGS. 8A and 8B is a flow diagram of an example method suitable for bonding to form the bonded quartz wafer package of FIGS. 1A and 1B using a wafer bonder including a flat top plate, in accordance with embodiments of the present disclosure.
Figure 8B:
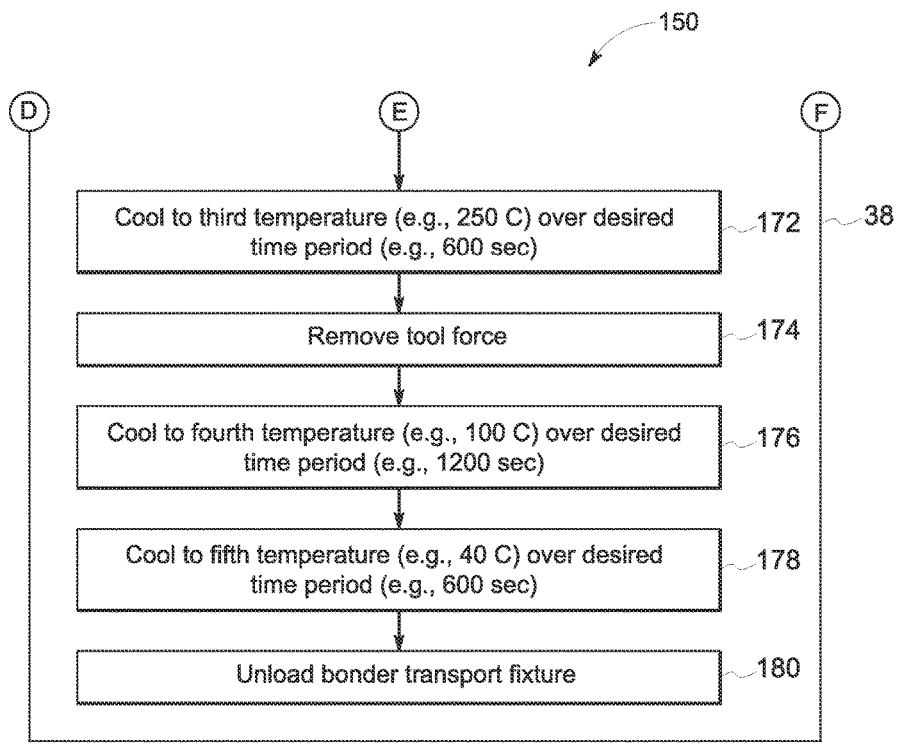

FIGS. 8A and 8B is a flow diagram of an embodiment of a method 150 suitable for bonding the stack 11 to form the bonded quartz wafer package 10 (e.g., stack 11) of FIGS. 1A and 1B (method block 38 of FIG. 2) using a wafer bonder tool including a flat top plate. The flat top plate has a larger surface area than the anodic pin top plate and, thus, the differences between the method 150 of FIG. 8 and the method 110 of FIG. 7 may include when to apply pressure/force using the larger plate. The illustrated method 150 includes loading the wafer bonder transport fixture including the quartz wafer package (e.g., stack 11) into the bonder tool (method block 152). The chamber of the bonder tool may be purged with nitrogen to prevent moisture from affecting the environment inside the device cavities of the device wafer 14 (method block 154). The method 150 may also include pump purging the chamber a desired number of times (e.g., 1, 2, 3, 4, 5) (method block 120) to further control the environment in and around and inside the stack 11.

Then, the illustrated method 150 includes ramping to a first temperature (e.g., 135, 140, 145, 150, 155° C.) inside the chamber over a desired time period (e.g., 800, 850, 900, 950 seconds) (method block 158). Once the first temperature is reached, the method 150 includes dwelling at the first temperature for a desired time period (e.g., 13, 14, 15, 16, 17 minutes) (method block 160) to allow the quartz materials, LCP, and Si to equilibrate. After the desired time period expires, the method 150 may include ramping to a second temperature (e.g., 280, 290, 300, 310, 320° C.), higher than the first temperature, over a desired period of time (e.g., 1600, 1700, 1800, 1900, 2000 seconds) (method block 162). Once the second temperature is reached, the method 150 includes dwelling at the second temperature for a desired time period (e.g., 33, 34, 35, 36, or 37 minutes) (method block 164). Then, the top plate may be applied to make contact with the stack 11 (method block 166) and the wafer bonder transport fixture clamps may be removed (method block 168), since the top plate is holding the materials of the stack 11 in place. Force (e.g., 140, 145, 150, 155, or 160 mBar) may be applied by the wafer bonding tool (method block 170).

The illustrated method 110 also includes cooling the chamber to a third temperature (e.g., 240, 250, 260° C.) over a desired time period. (e.g., 500, 550, 600, 650 seconds) (method block 172). Then, the wafer bonder tool force may be removed (method block 174) and the chamber may be cooled to a fourth temperature (e.g., 90, 100, 110° C.) over a desired time period (e.g., 1100, 1200, 1300 seconds) (method block 176). Once at the fourth temperature, the chamber may be cooled again to a fifth temperature (e.g., 30, 40, 50° C.) over a desired time period (e.g., 550, 600, 650 seconds) (method block 178). The bonding process may subsequently conclude and the wafer bonder transport fixture may be unloaded from the bonder tool (method block 180). At the end of the method 150, the device wafer 14 and the capping wafer 16 are bonded via the LCP bonding layer 20 to form the bonded quartz wafer package 10.

In some embodiments, the quartz layers 14 or 16 of the bonded quartz wafer package 10 may be thinned post-bonding. For SAW torque sensors, for example, thinning the bonded quartz wafer package 10 may increase the strain sensitivity of the SAW devices of the device layer 14 by reducing the amount of materials that can absorb transferred strain.

Figure 9:
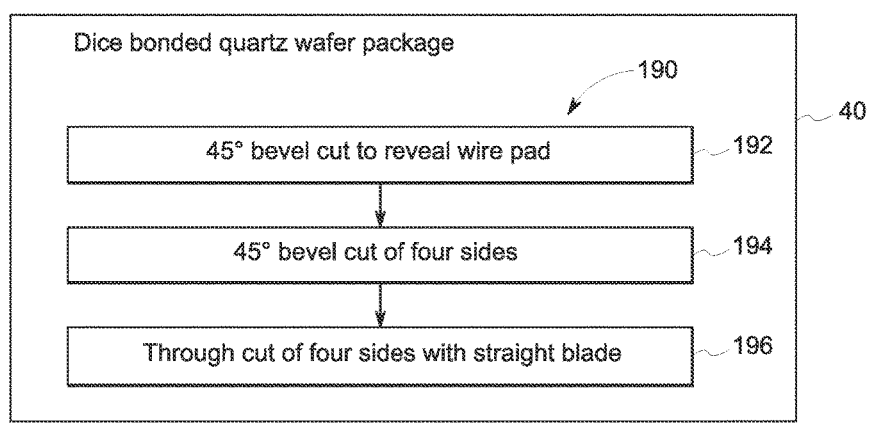
FIG. 9 is a flow diagram of an example method suitable for dicing the bonded quartz wafer package of FIGS. 1A and 1B, in accordance with embodiments of the present disclosure.

Once the stack 11 has been successfully bonded, the bonded quartz wafer package 10 may be diced into individual device dies (e.g., dice bonded quartz wafer packages 21). Accordingly, FIG. 9 is a flow diagram of an embodiment of a method 190 suitable for dicing the bonded quartz wafer package 10 of FIGS. 1A and 1B (method block 40 of FIG. 2), in accordance with embodiments of the present disclosure. The illustrated method 190 includes performing a bevel cut at a particular angle (e.g., 45°) to reveal wire pad areas that protrude underneath a seal ring (method block 192). The bevel cut performed of method block 192 may only dice through the capping wafer 16. Then, another bevel cut may be performed at a particular angle (e.g., 45°) along four sides surrounding individual devices that partially cuts into the device wafer 14 (method block 194). Last, a straight cut is performed on each of four sides of the individual devices of the bonded quartz wafer package 10 that cuts all the way through the bonded quartz wafer package 10 (method block 196). After the method block 196, each of the devices of the bonded quartz wafer package 10 may be a dice bonded quartz wafer package 21. The illustrated method 190 allows the dicing of the bonded quartz wafer package 10 in a manner that minimizes the amount of the device wafer 14 that is exposed. In addition, a barrier coating (e.g., silicon nitride, aluminum oxide, silicon oxide, metal, titanium) may be applied over the dice bonded quartz wafer packages 10 for additional hermeticity.

Figure 10:
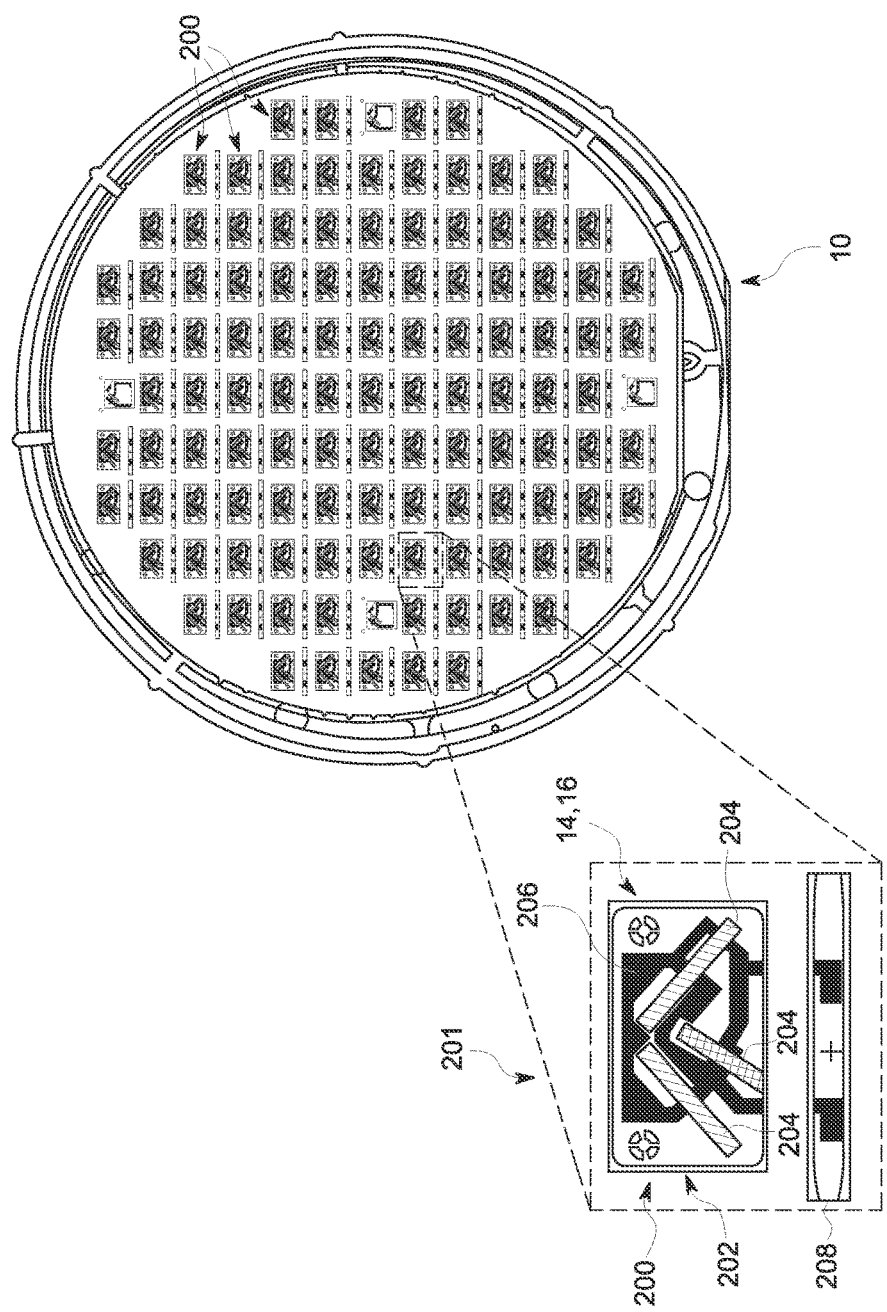
FIG. 10 is a top-down view of the quartz wafer package of FIG. 1A that includes numerous SAW devices, in accordance with embodiments of the present disclosure.

FIG. 10 is a top-down image of a bonded quartz wafer package 10 including numerous SAW devices 200 disposed thereon, in accordance with embodiments of the present disclosure. As should be appreciated, since the depicted embodiment of the bonded quartz wafer package 10 does not include spacers, more SAW devices 200 are able to fit onto the bonded quartz wafer package 10 than if spacers were used. As illustrated in the blown up perspective view 201, the SAW device 200 includes a cavity 202 formed between the device wafer 14 and the capping wafer 16. Three interdigitating structures 204 are disposed inside the cavity 202 and are capable of converting surface acoustic waves to electrical signals. Also, each SAW device 200 includes an interconnect 206 disposed within the cavity 202. In addition, each SAW device 200 may include a wire pad 208 that enables electrical coupling to the device 200.

Figure 11:
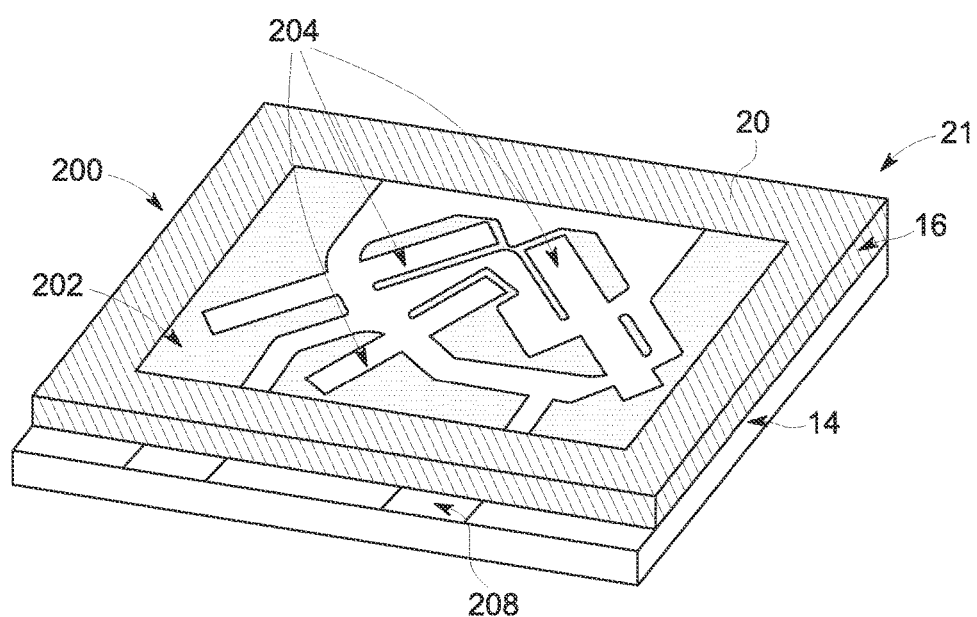
FIG. 11 is a perspective view of a dice bonded quartz wafer package, in accordance with embodiments of the present disclosure.

FIG. 11 is a perspective view of a dice bonded quartz wafer package 21, in accordance with embodiments of the present disclosure. The dice bonded quartz wafer package 21 results from singulation of the bonded quartz wafer package 10 (e.g., dicing the bonded quartz wafer package 10 into individual device dies), as described above. As illustrated, the dice bonded quartz wafer package 21 includes the device wafer 14 and the capping wafer 16 bonded via the LCP bonding layer 20. Also, the SAW device 200 includes the interdigitating structures 204 disposed in the cavity 202 formed between the device wafer 14 and the capping wafer 16. Further, as depicted, the wire pad 208 (e.g., I/O pads) is exposed to enable electrical coupling to the SAW device 200 of the dice bonded quartz wafer package 21.

Figure 12:
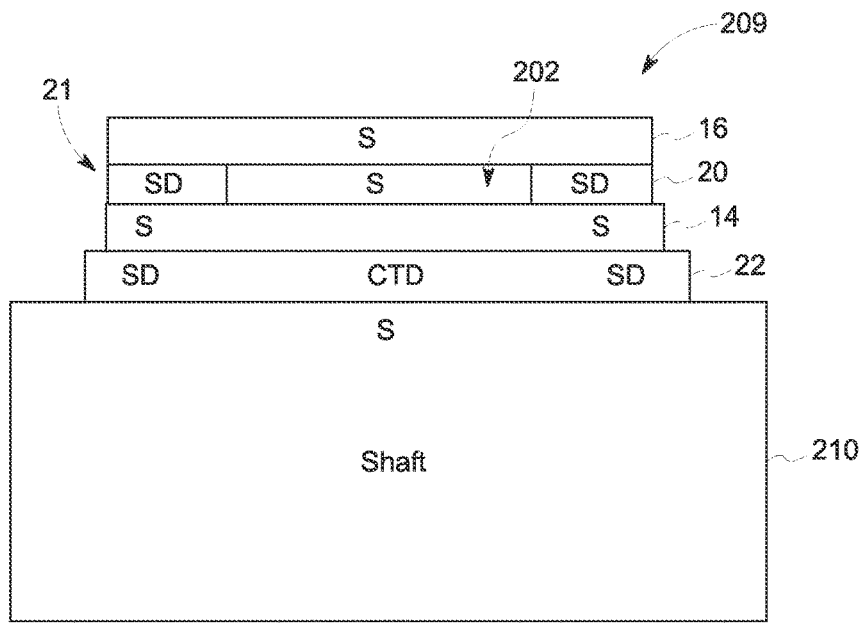
FIG. 12 is a diagram of the quartz SAW device operating as a torque sensor disposed on a shaft, in accordance with embodiments of the present disclosure.
Figure 13:
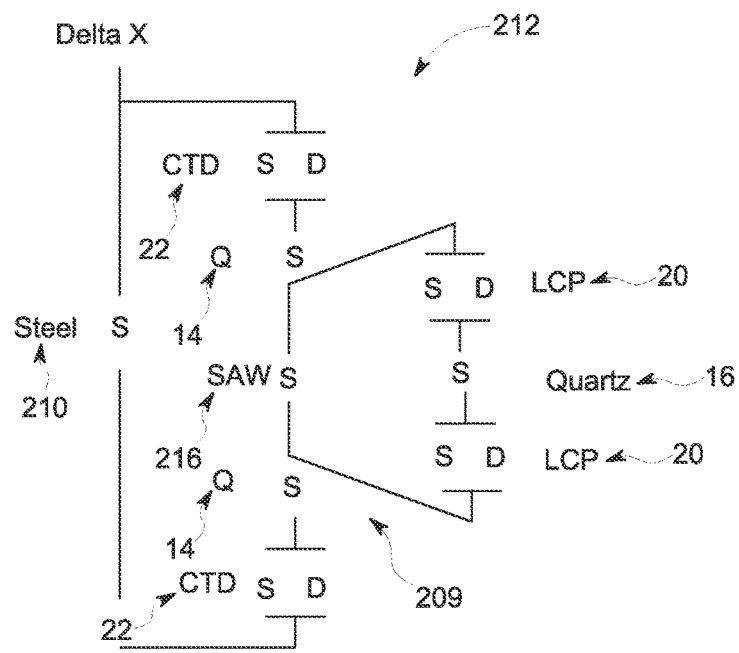
FIG. 13 is a model of forces impacting the quartz SAW device and shaft of FIG. 12, in accordance with embodiments of the present disclosure.
Figure 14:
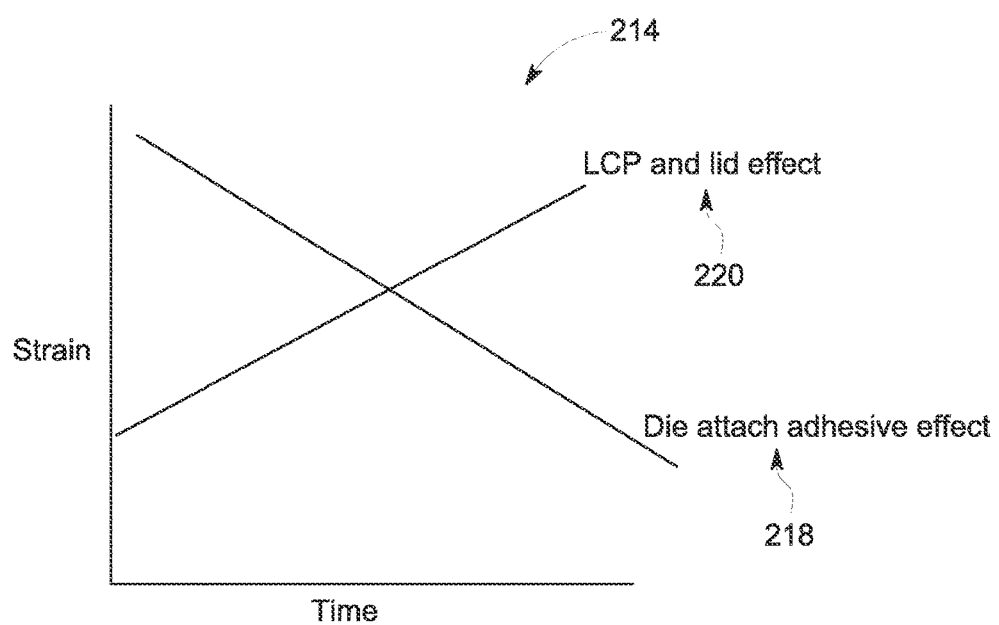
FIG. 14 is a graph displaying viscoelastic properties of the LCP oppositely matching the viscoelastic properties of a die attached adhesive, in accordance with embodiments of the present disclosure.

FIG. 12 is a diagram of a dice bonded quartz wafer package 21 (i.e., a die of the bonded quartz wafer package 10 after dicing) operating as a torque sensor 209 disposed on a shaft 210, in accordance with embodiments of the present disclosure. FIG. 13 is a model 212 of forces impacting the torque sensor 209 and the shaft 210 of FIG. 12, in accordance with embodiments of the present disclosure. FIG. 14 is a graph 214 displaying viscoelastic properties of the LCP bonding layer 20 oppositely matching and counteracting the viscoelastic properties of the die attached adhesive 22. For clarity, the figures are discussed together below. It should be noted that FIGS. 12 and 13 include abbreviations for a spring, denoted by "S," and for a spring damper, denoted by "SD."

As depicted in FIG. 12, the torque sensor 209 may be attached to the shaft 210 (e.g., steel) via the die attached adhesive 22. As previously discussed, when torque is applied to the shaft 210, there is a stress or strain on the shaft 210 that may transfer through the die attached adhesive 22 to the single crystal quartz of the device wafer 14 that includes the SAW device(s), the LCP bonding layer 20, and the single crystal quartz of the capping wafer 16. Thus, the shaft 210 may function as a spring that supplies a stress or strain to the torque sensor 209. The die attached adhesive 22 may function as a spring damper, the device wafer 14 may function as a spring, the LCP bonding layer 20 may function as a spring damper, and the capping wafer 16 may function as a spring.

The force model 212 of FIG. 13 helps illustrate the time dependence of viscoelastic properties of the adhesives of the torque sensor 209. There are two adhesives of the torque sensor 209: the die attached adhesive 22 and the LCP bonding layer 20. As depicted, a delta X strain may be applied by the steel shaft. At time 0, a load is carried to the die attached adhesive 22 due to overall displacement. The strain in the spring at the top of the device wafer 14 is the SAW output 216 that may be processed by a processor to determine the frequency of the strain. As the strain is transferred through the die attached adhesive 22, the spring damper comes into effect, and the spring constant of the die attached adhesive 22 becomes less on both sides of the adhesive 22, thereby decreasing the strain over time. That is, the viscoelastic properties of the die attached adhesive 22 causes the strain to decrease over time, which may affect the measurement of the strain by the torque sensor 209. However, the viscoelastic properties of the LCP bonding layer 20 provide an opposite, balancing effect, increasing strain over time to cancel out the aforementioned decreased strain of the die attached adhesive 22. Using LCP as the bonding layer provides the benefit of enabling matching of the viscoelastic time dependent behavior of the LCP bonding layer 20 and the die attached adhesive 22. In combination, the die attached adhesive 22 and the LCP bonding layer 22 can provide a self-compensating structure.

The die attached adhesive effect 218 and the LCP effect 220 are also depicted in the graph 214 of FIG. 14. As depicted, the die attached adhesive effect 218 shows the strain decreasing over time, while the LCP effect 220 shows the strain increasing over time. As such, for the torque sensor 209, the two effects can counteract one another to enable accurate torque measurements to be obtained.

Technical effects of the techniques include providing a quartz-based device that is bonded together via a LCP bonding layer. The bonding methods disclosed herein can overcome the challenges typically associated with single crystal quartz, such as its fragileness and its low coefficient of thermal expansion (CTE). As described above, the LCP bonding material provides several advantages, such as having a similar CTE to the single crystal quartz, a low elastic modulus to enhance sensitivity of the SAW devices, and time dependent viscoelastic properties that oppositely match the viscoelastic properties of the die attached adhesive 22, thereby enabling more accurate strain measurements by the SAW devices.

This written description uses examples to disclose the techniques, including the best mode, and also to enable any person skilled in the art to practice the techniques, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
arranging a stack of materials by:
disposing a first quartz wafer above a first silicon (Si) handle wafer;
disposing a second quartz wafer above the first quartz wafer;
disposing a liquid crystal polymer (LCP) sheet material between the first and second quartz wafer and holding the LCP sheet material to the first quartz wafer using a cover piece of glass, wherein the LCP sheet material has a thickness in a range of about 10 μm to about 200 μm;
disposing a second Si handle wafer above the second quartz wafer; and
bonding the stack of materials to form a bonded quartz wafer package, wherein the first quartz wafer is bonded to the second quartz wafer via the LCP sheet material.

2. The method of claim 1, wherein the first quartz wafer comprises at least one surface acoustic wave (SAW) device, wherein the first quartz wafer comprises a device wafer, and wherein the second quartz wafer comprises a capping wafer, the capping wafer providing cavities around device wafer.

3. The method of claim 1, wherein the LCP sheet material is prepared for bonding by cutting openings in the LCP sheet material to fit around one or more devices of the first quartz wafer and then vacuum baking the LCP sheet material.

4. The method of claim 3, wherein the LCP sheet material is vacuum baked at a temperature of from about 100° C. to about 120° C. for a time period of from about 1 hour to about 5 hours.

5. The method of claim 1, comprising, prior to bonding, tacking the LCP sheet material to the first quartz wafer around a perimeter of the first quartz wafer using a soldering iron, wherein the LCP sheet material comprises a lower elastic modulus than glass frit, and wherein the LCP sheet material comprises a lower coefficient of thermal expansion (CTE) than glass frit.

6. The method of claim 1, comprising:
subsequent to bonding, singulating the bonded quartz wafer package to form a dice bonded quartz wafer package; and
subsequent to singulating, attaching the bonded stack of materials to at least one of a helicopter, an airplane, an automobile, a boat, and a transmission.

7. The method of claim 6, comprising, subsequent to bonding, singulating the bonded quartz wafer package by:
performing a bevel cut at a first angle to reveal a wire pad of a device die;
performing bevel cuts at the first angle to four sides of the device die; and
performing a straight cut through the four sides of the device die.

8. The method of claim 7, wherein one of the wafers has a seal ring and further comprising applying a barrier coating over the dice bonded quartz wafer package, wherein the wire pad protrudes underneath a seal ring.

9. The method of claim 8, wherein the barrier coating comprises titanium.

10. The method of claim 6, comprising disposing a die attached adhesive between the first quartz wafer of the dice bonded quartz wafer package and a first substrate, wherein at least one viscoelastic property of the die attached adhesive matches at least one viscoelastic property of the LCP sheet material.

11. The method of claim 1, comprising, subsequent to bonding, removing the first and second Si handle wafers, wherein the bonded stack of materials acts as a torque sensor.

12. The method of claim 1, comprising, subsequent to bonding, thinning the bonded quartz wafer package.

13. The method of claim 1, wherein the first and second silicon handle wafers have a thickness in a range of about 100 μm to about 2000 μm.

14. The method of claim 1, wherein the first and second quartz wafers have a thickness in a range of about 50 μm to about 1000 μm.

15. The method of claim 1, further comprising aligning the LCP sheet material with the first quartz wafer by aligning fiducial markers on the LCP sheet material with fiducial markers on the first quartz wafer, the method further comprising:
- subsequent to baking, plasma ashing the first quartz wafer in a barrel.

16. The method of claim 1, wherein the stack is arranged in a wafer bonder transport fixture, the method further comprising:
- placing spacers into at least one cavity location on the first quartz wafer.

17. A method for bonding a quartz wafer package, comprising:
- bonding a first quartz wafer to a second quartz wafer using a bonding layer disposed in between the first and second quartz wafers to form the quartz wafer package, wherein the bonding layer comprises a liquid crystal polymer (LCP) material, and wherein bonding comprises:
  - purging a chamber of a wafer bonder tool that contains the quartz wafer package;
  - ramping to a first temperature over a desired time period inside the chamber;
  - applying a first force to the quartz wafer package using a top plate of the wafer bonder tool;
  - dwelling at the first temperature and the first force for a desired time period;
  - cooling to a second temperature over a desired time period inside the chamber;
  - removing the first force from the quartz wafer package; and
  - cooling to a third temperature over a desired time period inside the chamber.

18. The method of claim 17, wherein the first temperature is approximately 300° C.

19. The method of claim 17, wherein the top plate comprises an anodic pin top plate or a flat top plate.

20. The method of claim 17, wherein the first temperature is in a range of from about 280° C. to about 320° C.

21. The method of claim 17, wherein ramping to a first temperature is over a time period of from about 1600 seconds to about 2000 seconds, wherein purging a chamber comprises pump-purging the chamber with nitrogen.

22. The method of claim 17, wherein the second temperature is in a range of from about 240° C. to about 260° C.

23. The method of claim 17, wherein cooling to a second temperature is over a time period of from about 550 seconds to about 650 seconds.

24. The method of claim 17, wherein the third temperature is in a range of from about 90° C. to about 110° C.

25. The method of claim 17, wherein cooling to a third temperature is over a time period of from about 1100 seconds to about 1300 seconds.

26. A method for bonding a quartz wafer package, comprising:
- bonding a first quartz wafer to a second quartz wafer using a bonding layer disposed in between the first and second quartz wafers to form the quartz wafer package, wherein the bonding layer comprises a liquid crystal polymer (LCP) material, wherein bonding comprises:
  - purging a chamber of a wafer bonder tool that contains the quartz wafer package;
  - ramping to a first temperature over a desired time period inside the chamber;
  - dwelling at the first temperature for a desired time period;
  - ramping to a second temperature, which is higher than the first temperature, over a desired time period inside the chamber;
  - applying a first force to the quartz wafer package using a top plate of the wafer bonder tool;
  - dwelling at the second temperature and first force for a desired time period;
  - cooling to a third temperature over a desired time period inside the chamber;
  - removing the first force from the quartz wafer package;
  - cooling to a fourth temperature over a desired time period inside the chamber; and
  - cooling to a fifth temperature over a desired time period inside the chamber, wherein each of the first quartz wafer and the second quartz wafer comprises at least one cavity, and wherein at least three interdigitated structures are disposed with the at least one cavity of each of the first quartz wafer and the second quartz wafer.

* * * * *